Oct. 19, 1965 D. E. ST. JOHN 3,213,375
SYNCHRONIZED CONTROLLED PERIOD PULSE GENERATOR FOR
PRODUCING PULSES IN PLACE OF MISSING INPUT PULSES
Filed Aug. 1, 1963 2 Sheets-Sheet 1

INVENTOR:
Dale E. St. John
By Smyth, Roston & Pavitt
Attorneys

Oct. 19, 1965 D. E. ST. JOHN 3,213,375

SYNCHRONIZED CONTROLLED PERIOD PULSE GENERATOR FOR PRODUCING PULSES IN PLACE OF MISSING INPUT PULSES

Filed Aug. 1, 1963 2 Sheets-Sheet 2

INVENTOR:
Dale E. St. John

By Smyth, Roston & Pavitt

Attorneys

United States Patent Office 3,213,375

Patented Oct. 19, 1965

3,213,375

SYNCHRONIZED CONTROLLED PERIOD PULSE GENERATOR FOR PRODUCING PULSES IN PLACE OF MISSING INPUT PULSES

Dale E. St. John, Rolling Hills Estates, Calif., assignor to Arnoux Corporation, Culver City, Calif., a corporation of California Filed Aug. 1, 1963, Ser. No. 299,408
15 Claims. (Cl. 328—63)

Figure 1:
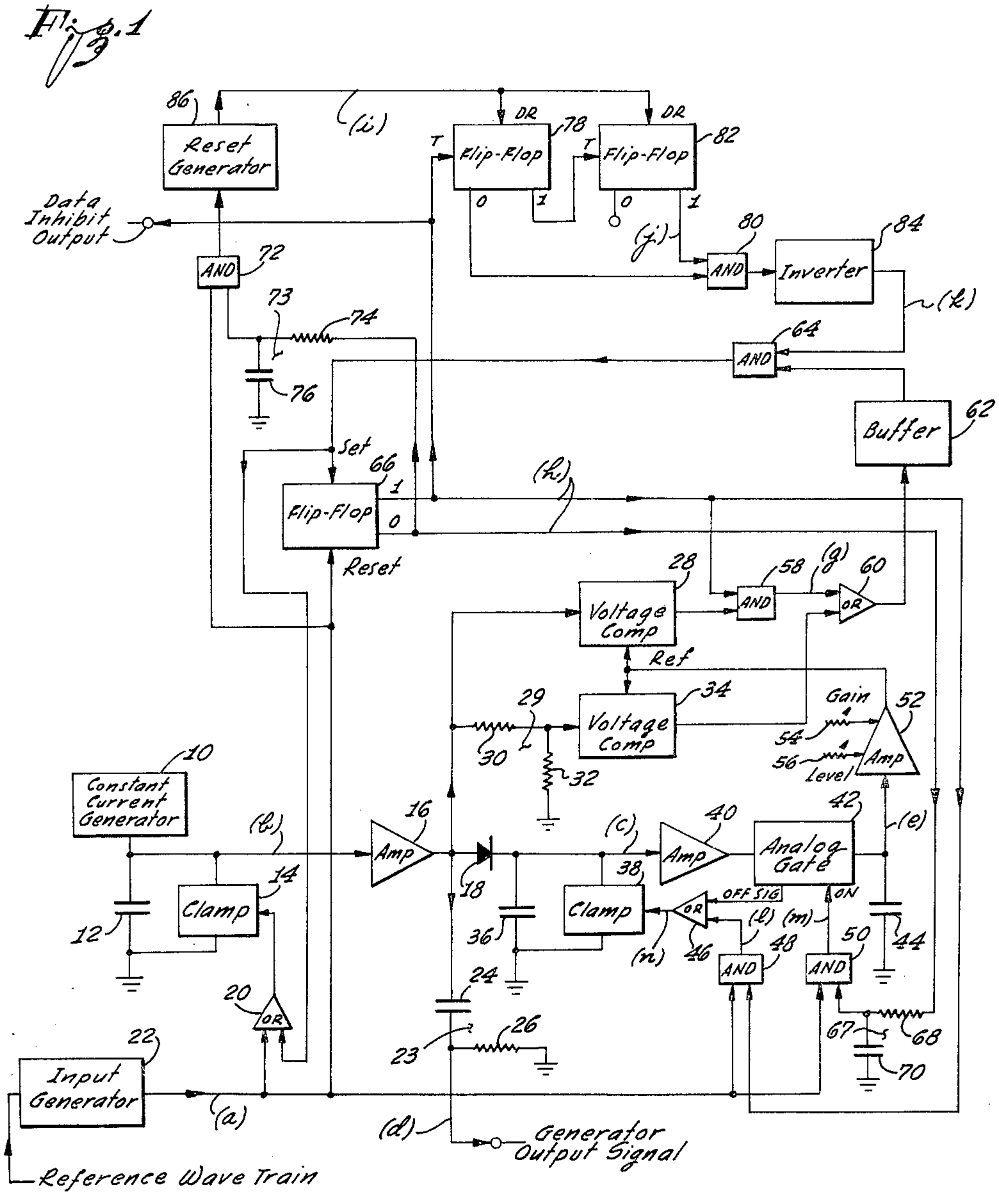

This invention relates to an oscillator or pulse generator. More specifically, the invention relates to a pulse generator having an output signal which is synchronized to an input signal so that the phase and period of the output signal produced by the pulse generator is the same as the input signal. This type of pulse generator may be used in telemetry receiving systems wherein time multiplex data is received and processed. The time multiplex signal may be a pulse signal which can be modulated in one of many forms. For example, pulse code modulation, pulse amplitude modulation, pulse duration modulation, etc. In all of these types of time multiplexed signals processing of the data contained in the pulse signal requires that various circuits be synchronized with the incoming pulse signal. This synchronization is obtained by the use of the synchronized pulse generator.

However, problems occur in the synchronization of the pulse generator during periods when the pulses are missing from the input signal. Since it is important that the pulse generator maintain synchronism with the input signal, even though the pulses are missing from the input signal, the pulse generator must continue to develop the pulse output signal during periods when the input signal is intermittently absent. It is also important that the output signal generated during the absence of the input signal has the same pulse period as was present in the input signal.

Pulse generators have been devised in the prior art which are synchronized with an input signal. One method of synchronizing a pulse generator is by the use of the phase lock principle where the phase of a voltage controlled oscillator is compared to the phase of an incoming signal and an error signal is developed which corrects the phase of the output signal from the oscillator. The correction of the phase, of course, also corrects the frequency. The error signal is also integrated by a circuit which stores the oscillator control volage during periods of missing input signal so that the pulse oscillator is controlled to generate the output signal at the same frequency for a certain period of time.

The phase lock type of system has certain disadvantages since the phase-sensing circuits do not function correctly when the oscillator is out of phase with the incoming signal more than a certain valve. This necessitates complicated capture circuits which correct the oscillator frequency to a point where the phase-detecting circuits function correctly. The phase lock system, therefore, is limited in its correction to a relatively low value in the rate of change of the input signal frequency.

Another prior art method of synchronizing an oscillator or pulse generator utilizes the principle of converting the input signal frequency to an analog voltage, The analog voltage is then used to voltage control an oscillator to the correct frequency. Correct phase relationship is maintained in this type of system by using the input for synchronization. The frequency analog voltage is stored so that during the absence of an input signal the oscillator frequency is maintained near the desired frequency.

A major disadvantage of this system is the difficulty in maintaining the correct transfer function between the input frequency and the controlled oscillator frequency with variations in the input frequency. This is because the system is not a closed loop system and, therefore, any variations in the frequency-detecting circuits or changes in the oscillator voltage control sensitivity cause the oscillator to operate at an incorrect frequency when the input signal is absent.

Also, the input frequency to oscillator frequency transfer function must be adjusted so that the voltage controlled oscillator period is slightly greater than the input signal period so that phase synchronization can be maintained by using the input signal for synchronization. This results in a disadvantage since the oscillator frequency must be voltage controlled to have a period greater than the input signal period during the absence of an input signal and, therefore, synchronization between the equipment transmitting the input signal and the controlled oscillator is lost after only a relatively short period of time. This occurs even though the analog controlling voltage remains constant in the storing circuit.

The invention of the present application overcomes the disadvantages of the prior art system by using a synchronized controlled period pulse generator which develops an output pulse at the same rate as an input reference signal and with the leading edges of the output pulses being coincident with the leading edges of the reference pulses. Means are responsive to the input pulse reference signal for generating a signal having an amplitude in accordance with the time displacement between successive pulses in the input pulse signal. During periods of intermittent operation when the reference signal is missing, output pulses are generated at the same rate as the last two available reference pulses and the output pulses are generated with a phase relationship 180° lagging the last-received reference pulses. This allows for a maximum change in the input signal frequency rate while the input frequency is missing while still maintaining synchronism when the input signal reappears.

The output pulses are generated by using a linear voltage ramp generator with circuit means for discharging the ramp generator to the original starting point at a fast rate. Means are used to continuously sample the peak value of the voltage generated by the linear voltage ramp generator and additional means are used to store that value. This stored signal is an indication of the period between the previous two input pulses. As long as the input signal is present, an output pulse is produced by the discharging of the linear voltage ramp generator at each appearance of an input pulse.

When input pulses are missing, the linear voltage ramp generator is allowed to generate a voltage approximately one and one-half times as large as the voltage stored. At this time a voltage comparator discharges the linear voltage ramp generator to produce an output signal. This output signal is effectively 180° out of phase with the previous two output signals. At all times after this when the input signals are missing, an output pulse is generator in accordance with the stored value of the signal representative of the period between the last two input reference pulses. The system continues to operate in this fashion until the appearance of a pulse in the input signal which then discharges the linear voltage ramp generator. This system then continues to generate output pulses in accordance with the input signal.

Figure 2:
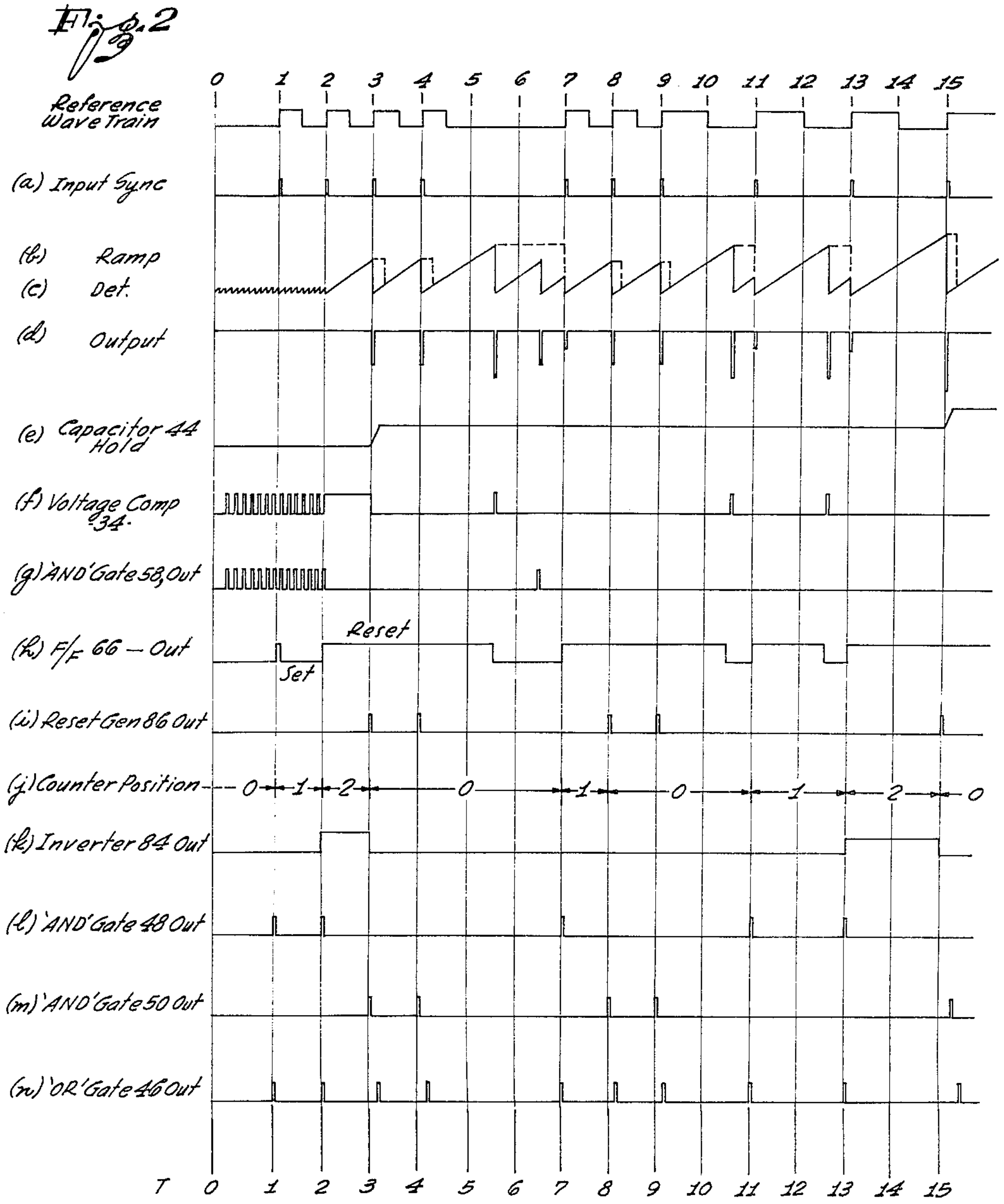

The invention also incorporates means for initially starting the system to generate the output pulses of a proper frequency. Also, the system includes an auxiliary circuit to determine whether the input signal is missing or whether there has been a change in the frequency of the input pulses. For example, if the input signal has its frequency decreased a sufficient amount, this may give the appearance of missing pulses, The system of the present invention, however, distinguishes between missing pulses and a change in frequency so as to shift the operation of the pulse generator to produce output pulses at the new frequency rate. The structure and operation of the present invention will become clearer with reference to the following figures wherein:

FIGURE 1 is a block diagram of a system for producing output pulses in accordance with the concepts of this invention, and FIGURE 2 is a series of curves marked (*a*) through (*n*) used in explaining the operation of the system shown in FIGURE 1.

In FIGURE 1 a constant current generator 10 is connected to the common juncture of a capacitor 12 and a clamp circuit 14. The capacitor 12 and clamp circuit 14 are electrically in parallel and are disposed to a reference potential such as ground. An amplifier 16 is coupled between the constant current generator 10 and the anode of a diode 18. An "or" gate 20 has its output applied to the clamp 14 to control the operation of the clamp 14. One of the inputs to the "or" gate 20 is from an input signal generator 22. The output signal from the pulse generator shown in FIGURE 1 is taken from the junction of the amplifier 16 and the diode 18 and passes through a differentiator 23 consisting of a capacitor 24 in series and a resistor 26 in shunt.

Also connected to the junction of the amplifier 16 and diode 18 are a voltage comparator 28 and a voltage dividing network 29. The voltage dividing network 29 consists of a resistor 30 in series and a resistor 32 in shunt. The output from the voltage dividing network 29 is applied to a second voltage comparator 34. A capacitor 36 and a clamp 38 are disposed in parallel between the cathode of the diode 18 and the reference potential such as ground. Also connected to the cathode of the diode 18 is the input to an amplifier 40 which has its output coupled to an analog gate 42. A capacitor 44 is electrically disposed between the output of the analog gate 42 and the reference potential such as ground.

The output of an "or" gate 46 controls the clamp 38. One input to the "or" gate 46 is from an "and" gate 48. The other input to the "or" gate 46 is a signal from the analog gate 42 which indicates that the analog gate is off. The "and" gate 48 has as one of its inputs the signal from the input generator 22. An "and" gate 50 has its output coupled to the analog gate 42 to turn the analog gate on and off. One of the inputs to the "and" gate 50 is from the input generator 22.

An amplifier 52 is electrically disposed between the capacitor 44 and the reference inputs to the voltage comparators 28 and 34. The output signal from the amplifier 52, therefore, serves as a reference potential for the voltage comparators. In order to insure a proper reference signal, the amplifier is shown to be controlled by variable resistors 54 and 56 as illustrative of gain and level controls for the amplifier 52. The output signal from the voltage comparator 28 is applied to an "and" gate 58. The output terminal of the "and" gate 58 is connected to an input terminal of an "or" gate 60. A second input is applied to the "or" gate 60 from the voltage comparator 34.

The output from the "or" gate 60 passes through a buffer amplifier 62 and is connected as a first input to an "and" gate 64. The output from the "and" gate 64 is applied to a flip-flop 66 and the appearance of a signal from the "and" gate 64 sets the flip-flop 66. The reset of the flip-flop 66 is provided by the signal from the input generator 22. The flip-flop 66 has two output terminals designated as 1 and 0 and two input terminals designated as set and reset. The output from the 1 terminal is applied to the "or" gate 20, the "and" gate 58 and the "and" gate 48. The output from the 0 terminal of the flip-flop 66 is applied through a first time delay circuit 67 to the "and" gate 50. The time delay circuit 67 consists of a resistor 68 in series and a capacitor 70 in shunt.

The output from the 0 terminal of the flip-flop 66 is also applied through a second time delay circuit 73 to an "and" gate 72. The second time delay circuit 73 consists of a resistor 74 in series and a capacitor 76 in shunt. The second input to the "and" gate 72 is the signal from the input generator 22. The 1 terminal of the flip-flop 66 is also connected to a second flip-flop 78. The output from the 1 terminal of the flip-flop 66 may also be used as a data inhibited output in the pulse generator system. The 0 terminal of the flip-flop 78 is connected to an "and" gate 80 and the 1 terminal is connected to a flip-flop 82. The output from the 1 terminal of the flip-flop 82 is applied as a second input to the "and" gate 80. The "and" gate 80 has its output connected to the "and" gate 64 through an inverter 84. The flip-flops 78 and 82 have their resets controlled by a reset generator 86. The reset generator 86 is in turn controlled by the output from the "and" gate 72.

The block diagram described above operates as a pulse generator with the individual components interrelated to perform the following functions: The constant current generator 10, capacitor 12 and clamp 14 comprise a voltage ramp generator which produces a linear increase in voltage on the capacitor 12 with time. The capacitor 12 is discharged at a predetermined time by the clamp 14, at which time the charging cycle is repeated. The voltage on the capacitor 12 is connected to a peak detecting circuit consisting of the diode 18 and the capacitor 36 by the isolating amplifier 16. The potential on the capacitor 36 is discharged at the desired times by the clamp 38. The output from the peak detector is connector to the input of the analog gate 42 through the isolating amplifier 40. When the analog gate is turned on by a true signal from the "and" gate 50, capacitor 44 is charged to the potential on capacitor 36. The analog gate stays on for a predetermined length of time and may be controlled, for example, by a one-shot multivibrator included in the gate circuitry 42. The voltage on the capacitor 44 is held after the analog gate 42 turns off.

The voltage on the capacitor 44 is applied as the reference inputs of the voltage comparators 28 and 34 through the isolating amplifier 52. The voltage comparator 28 produces an output signal when the input to the voltage comparator 28 is 100% of the reference voltage. The voltage comparator 34 produces an output signal when the input to the voltage divider network 29 consisting of resistors 30 and 32 is 150% of the reference voltage. When the analog gate 42 turns off, the off signal from the analog gate is true and therefore the output from the "or" gate 46 is also true. The signal from the input generator 22, which is derived from the leading edges of the input signal to be synchronized with, is connected to the "or" gate 20 and to the "and" gates 48, 50 and 72 and to the reset input of the bistable multivibrator flip-flop 66.

The output from amplifier 16, which is the linear ramp voltage, is also connected to the voltage comparator 28 and to the voltage comparator 34 input. It will be noted that the voltage comparators 28 and 34 are identical. However, the voltage divider 29 consisting of resistors 30 and 32 allows two-thirds of the signal from the amplifier 16 to be applied to the voltage comparator 34.

The outputs from voltage comparators 28 and 34 are connected to "and" gate 58 and "or" gate 60, respectively. The 1 output of the flip-flop 66, which is true when the bistable is set, is connected to "and" gate 58, "and" gate 48, and the trigger input of flip-flop 78. The 1 output is also available as the data inhibit output signal. The 0 output from flip-flop 66, which is true when the bistable is reset, is connected to "and" gate 72 through the time delay circuit 73 and to "and" gate 50 through time delay circuit 67. The time delay circuits are integrators which provide a small time delay in the enabling action of the gates 50 and 72.

The output from "and" gate 58 is connected to "or" gate 60 and the output from "or" gate 60 is connected to the input of an isolating amplifier 62. The output of this isolating amplifier is connected to "and" gate 64 and the output of "and" gate 64 is applied to the set input of flip-flop 66 and also to the "or" gate 20. The flip-flops 78 and 82 are connected as a counter to count the transitions of flip-flop 66 from set to reset. The counter is reset to 0 by a signal from the reset generator 86 which is controlled by a true signal from the "and" gate 72. The counter is connected to "and" gate 80 which has a true output on a count of two. It will be appreciated that additional flip-flops may be connected to provide counts of more than two. It will be appreciated that additional flip-flops may be connected to provide counts of more than two.

The output from the "and" gate 80 passes through inverter 84 and is applied to the "and" gate 64. The output signal from the pulse generating system is the differentiated output of the ramp voltage at the output of the amplifier 16. The operation of the block diagram shown in FIGURE 1 can be better understood with reference to the curves illustrated in FIGURE 2. The various curves labeled (*a*) through (*n*) are representative of the signals which appear at the positions marked (*a*) through (*n*) in FIGURE 1.

The curves as shown are broken into a plurality of time periods from zero time to a time of 15. A reference wave train, illustrative of an incoming pulse signal, is shown at the top of the curves. It will be appreciated that between times 1 to 5 the reference wave train consists of four consecutive pulses which constitute a normal input signal. Between times 5 to 7 the pulses in the input signal are missing. Between times 7 to 9 the pulses in the input signal reappear at the same frequency as during times 1 to 5. Between times 9 through 15 the pulse frequency is shown to instantaneously decrease by one-half. The reference wave train is applied to the input generator 22 which generates an input sync signal having a pulse corresponding to the leading edge of every pulse contained in the reference wave train. The operation of the system of FIGURE 1 as shown by the curves of FIGURE 2 is broken into four time periods. First, when power is first applied to the system; second, when the system is operating under normal conditions; third, when the system is supplying missing pulses, and fourth, when the system is subjected to a severe decrease in frequency of the input signal.

When power is first applied to the circuit prior to the introduction of the input sync signal, capacitors 12, 36 and 44 are discharged. The ramp generator capacitor 12 starts to charge at a linear rate. The flip-flop 66 may be either set or reset initially but since capacitor 44 is discharged the reference signal on the voltage comparators 28 and 34 is zero. The increase in voltage on capacitor 12 which is connected to the voltage comparators through the amplifier 16 causes the voltage comparators to switch on.

Initially we will assume that the counter consisting of flip-flops 78 and 82 has a count of zero. Therefore, both inputs to the "and" gate 64 are true and the output from "and" gate 64 sets flip-flop 66 and discharges the ramp capacitor 12 through the "or" gate 20 and the clamp 14. This action repeats so long as no input sync signal is available, and this is shown in the wave forms in FIGURE 2 from the time zero when power is applied to the time 1 when the first sync pulse is available.

The first sync pulse at time 1 discharges capacitor 12 through "or" gate 20 and clamp 14 and, in addition, discharges capacitor 36 through the "and" gate 48, the "or" gate 46 and the clamp 38. The gate 48 is enabled by a true signal from the 1 output of the flip-flop 66 when the flip-flop is in its set state. The gate 50 is inhibited by the 0 output from the flip-flop 66 when the flip-flop 66 is in the set state. The input sync pulse also resets the flip-flop 66 but not before the preceding action takes place. Capacitor 36 and diode 18 form the peak detector that holds the highest potential that capacitor 12 charges to until discharged by the clamp 38. When the flip-flop 66 is reset by the input sync pulse the counter is advanced to the count of 1.

The ramp and comparator action continues as described above until the second sync pulse is received at the time 2. This sync pulse produces the same action as the first except that the counter is advanced to a count of 2. A count of 2 causes a false input to the "and" gate 64 by means of the "and" gate 80 and the inverter 84. This action inhibits the voltage comparator outputs from setting flip-flop 66 and clamping the voltage on the ramp capacitor 12 to zero. The ramp capacitor, therefore, continues to charge until the time 3 when the third sync pulse arrives. The third pulse triggers the analog gate 42 on through the "and" gate 50 which is enabled by the reset condition of the flip-flop 66.

The third sync pulse also resets the counter back to zero through the "and" gate 72 and reset generator 86 and discharges the ramp capacitor 12 through the "or" gate 20 and clamp 14. When capacitor 12 is discharged, the peak potential that it charges to between times 2 and 3 is held by the peak detector capacitor 36. Since the analog gate has been triggered on, this peak voltage is transferred to the storage capacitor 44 through the amplifier 40 and the analog gate 42. The gate is held on long enough to insure that capacitor 44 is fully charged.

When the analog gate 42 turns off, an off pulse is generated which triggers clamp 38 through the "or" gate 46. The capacitor 36 is therefore discharged to the potential on the capacitor 12 which has started a new charging cycle. The discharge of capacitor 12 at time 3 produces an output pulse by means of the differentiating action of the capacitor 24 and resistor 26. This output pulse is coincident with the leading edge of the input sync pulse which is the leading edge of the third reference pulse. The preceding describes the circuit action from the time power is initially applied to the time when a voltage proportional to the period between two input pulses is stored on the capacitor 44.

Capacitor 12 continues to charge until the next sync pulse arrives at the time 4 at which time capacitor 12 is discharged and the peak potential that it charged to is transferred to the holding capacitor 44 through the action of the peak detector and the analog gate. If the frequency of the reference wave train has changed during the time period between 3 and 4, a different voltage level is stored by holding capacitor 44 at time 4 than was stored at time 3. When flip-flop 66 was reset at time 2 the output of the voltage comparator 28 was inhibited by the action of the "and" gate 58. The voltage comparator 34 is not inhibited, however, since the ramp voltage must rise to 150% of the voltage stored on capacitor 44 before the comparator 34 switches on. Therefore, the voltage comparator 34 remains off during the time period between times 2 and 4.

The ramp capacitor 12 continues to charge and discharge in synchronization with the reference wave train so long as the time period between each successive pulse in the reference wave train does not exceed 150% of the period of the last preceding pulse. It is then evident that an output pulse is generated in synchronism with the leading edges of the reference wave train so long as the reference signal frequency does not decrease by more than 50% during the period between any two successive pulses.

Between the times 4 to 7 two input pulses which would normally appear at times 5 and 6 are missing. Capacitor 12 starts to charge at time 4 but is not discharged at time 5 since the input sync pulse is missing to control "or" gate 20. Therefore, capacitor 12 continues to charge until it reaches a potential 50% greater than the potential stored by capacitor 44. The charge on capacitor 44 is analogous to the period between time 3 and time 4. When the potential on capacitor 12 is 50% greater, the voltage comparator 34 switches on. The true signal from the voltage comparator 34 sets flip-flop 66 through "or" gate 60, amplifier 62 and "and" gate 64 and also discharges capacitor 12 to produce an output pulse. It will be noted that this pulse is shifted 180° from the reference signal, since the voltage comparator 34 switches on at a time midway between times 5 and 6.

Capacitor 12 starts a new charging cycle and continues to charge until it reaches the potential stored on capacitor 44. The potential on the capacitor 44 is still analogous to the period between time 3 and time 4. At this potential the voltage comparator 28 is switched on. Since flip-flop 66 is in the set state, gate 58 is enabled and the output of the voltage comparator 28 is connected to gate 64 through the isolating amplifier 62. The counter consisting of flip-flops 78 and 82 is in the position 0. Therefore, the gate 80 is inhibited but the action of the inverter 84 enables the gate 64 to discharge the ramp capacitor 12 through the "or" gate 20 and clamp 14 to produce another output pulse.

The period between the output pulse generated between the action of the voltage comparator 34 and the output pulse generated by the action of the voltage comparator 28 is determined by the potential stored on the holding capacitor 44. Since this potential is analogous to the period between the last two received input sync pulses, the period between these two last generated pulses is equal to the period between the last two received reference pulses. The phase of the pulses added when the input pulses are missing is 180° lagging from the true reference signal. If the pulse in the reference signal continues to be missing, the circuit described above continues to make up pulses.

As the charge on the holding capacitor 44 slowly changes, the frequency of the pulses changes until such time as the total number of made-up pulses is different than required to maintain synchronism with the reference signal. The holding circuit, however, can be designed using present techniques to hold the output signal in sync with the missing reference signal for periods up to one minute or more, dependent on the time available for charging the holding capacitor 44. While the system shown uses an analog voltage charge on a capacitor to retain the rate information, digital techniques could be employed to hold the rate information indefinitely. Digital methods of holding rate data, however, are more costly and normally not required due to the relatively long holding time attainable with the capacitor charge method.

The 180° phase shift between the made-up pulses and the reference signal is significant since this amount of shift provides synchronism between the made-up pulses and the reference signal with the greatest possible variation in the reference signal in either direction during the period when the reference signal is missing. It can be seen that the use of 180° phase shift puts the output pulse, for example, midway between times 5 and 6.

If the reference wave train should change in frequency while the reference pulses are missing, the use of the 180° phase shift allows this change in frequency to be an equal amount in either direction while still maintaining synchronism within the system. Therefore, the use of the 180° phase shift provides the greatest degree of frequency change in the reference wave train during the time that the input pulses within the reference wave train are missing.

When the first input sync pulse is received after a period of missing pulses, for example, at time 7 as shown in FIGURE 2, the ramp capacitor 12 is discharged by the "or" gate 20 and clamp 14 to develop an output pulse. The capacitor 36 is also discharged and the flip-flop 66 is reset. When flip-flop 66 changes from the set to reset condition the counter is triggered to a position of 1. It will be noted that the analog gate is not switched on by this sync pulse since the "and" gate 50 is inhibited during the duration of the sync pulse by the set condition of the flip-flop 66. The time delay circuit consisting of the resistor 68 and the capacitor 70 prevents a true signal at the "and" gate 50 until after the input sync signal has terminated, even though the sync signal has changed flip-flop 66 to the reset state.

When flip-flop 66 is reset, any output signal from the voltage comparator 28 is inhibited by a false control input to the "and" gate 58 from the flip-flop 66. The ramp capacitor 12 charges on a new cycle until the next input sync pulse at time 8. This sync pulse resets the counter to 0, since the gate 72 is enabled by a true signal from the flip-flop 66. This sync pulse also discharges capacitor 12 and turns on the analog gate 42 since the "and" gate 50 is now enabled by the reset state of the flip-flop 66.

The analog gate 42 allows capacitor 44 to charge to the new potential held by capacitor 36 which is proportionate to the period between the last two input sync pulses. At the completion of the analog gate on time, an off pulse is generated which discharges the peak holding capacitor 36 through the "or" gate 46 and clamp 38 to the new ramp potential. At the time 8 the circuit has functioned through a period of two missing reference pulses and has been switched back to the normal operating condition where a reference signal is stored on the capacitor 44 indicative of the time period between the first two reference pulses generated after the missing pulse period.

The system shown in FIGURE 1 generates an output pulse for each input sync pulse even when the input sync pulse frequency instantaneously shifts to a higher value. The amount of frequency shift is only limited by the characteristics of the circuits employed and not by the circuit logic. Therefore, the system can tolerate a very large increase of the input sync pulse frequency. An output pulse also may be generated for each input pulse during an instantaneous decrease in the reference signal frequency of up to approximately 50%. A decrease in frequency greater than 50% means that the period between two successive pulses increases by more than 50%.

The amount of decrease in frequency which the system tolerates is determined by the characteristics of the voltage comparator 34. It would be possible, for example, to use a voltage comparator which could tolerate an instantaneous decrease in frequency of 100%, but this would have a disturbing effect on the amount of frequency change that the system can tolerate during a missing pulse period. Therefore, an instantaneous increase in the period between two succesive pulses due to a decrease in the reference frequency may sometimes be equivalent to the condition where the input reference frequency has not changed but a reference pulse is missing. The system would then operate to make up missing pulses as previously described instead of changing its frequency of operation. It is obvious that a method of detecting instantaneous frequency decreases of more than 50% must be provided; otherwise, the system would continue to treat the reference signal as having missing pulses and the output pulses would continue at the frequency of the reference signal prior to the frequency decrease.

The detection of a frequency decrease of more than 50% is accomplished by the counter consisting of the flip-flops 78 and 82, the "and" gate 64 and the reset generator driven by the "and" gate 72. These circuits also function in the initial start-up process, as previously explained. As shown in FIGURE 2, an instantaneous decrease in reference frequency of 100% is shown at the time 9. The ramp capacitor 12 is discharged at the time 9 and then charges until the voltage comparator 34 is switched on. The output signal from comparator 34 sets flip-flop 66 and discharges capacitor 12.

The capacitor 12 starts on a new charging cycle and is discharged upon the appearance of the next input sync pulse at the time 11. Also at time 11 capacitor 36 is discharged, and the flip-flop 66 is reset. When the flip-flop 66 changes from set to reset, the counter is triggered to a count of 1. The capacitor 12 again charges to 150% of the potential on the capacitor 44 which is still analogous to the reference frequency prior to the change. The voltage comparator 34 switches on as before, discharging the capacitor 12 and setting the flip-flop 66. The capacitor 12 is on a new charging cycle when at time 13 the input pulse discharges capacitors 12 and 36 and resets flip-flop 66.

When flip-flop 66 is reset, the counter is triggered to a count of 2. This count of 2 gives a true output from the "and" gate 80 which is inverted to give a false output to the gate 64. The ramp capacitor 12, therefore, continues to charge on the next cycle past the time when the voltage comparator 34 switches on, since the output from the voltage comparator 34 is inhibited by the "and" gate 64 and does not discharge the capacitor 12 nor set the flip-flop 66. Capacitor 12, therefore, continues to charge until the next input sync pulse at the time 15. This input pulse discharges capacitor 12 and turns on the analog gate 42 since the "and" gate 50 is enabled by the reset state of the flip-flop 66.

Holding capacitor 44 is charged to the potential held by the capacitor 36 which is now analogous to the new reference signal frequency. The input sync pulse at the time 15 also resets the counter to 0, since the gate 72 is enabled by the reset condition of the flip-flop 66. It will be appreciated that when the input frequency decreases by more than 50% extra pulses will be inserted in the output from the system shown in FIGURE 1. However, in the systems in which the pulse generator of the present invention is used a master synchronizing signal is applied at the beginning of a frame or group of reference pulses. When the master signal is applied, the system locks into synchronism at the new frequency rate.

It will be appreciated that the counter consisting of the flip-flops 78 and 82 provides for a count of 2 before the system is corrected when the input frequency decreases by more than 50%. This counter may be designated to have a higher count if certain undesirable conditions are expected to be present within the reference signal. For example, if there are actually missing pulses and no reference frequency rate change, the counter is reset to 0 by two consecutive pulses at the correct rate following every missing pulse group and the counter never reaches the count which inhibits the make-up pulses. There is also a possibility of having a missing pulse group followed by only one pulse and then another missing pulse group. This possibility is small and a count of 2 for the inhibiting action is usually sufficient. However, if this condition does occur the circuit would switch out of the missing pulse mode, even though the reference pulses were actually missing.

The probability of this undesired action occurring may be essentially eliminated by requiring the counter to count to a relatively high number before the inhibiting action takes place. The number chosen depends on the calculated or known maximum possible consecutive groups of missing pulses, each group separated by only one pulse. However, the use of a higher counter delays the time in which the reference wave train can be corrected if the frequency of the reference wave train decreases by 50% or more.

It will be appreciated that other modifications may be made to the system described in the present application. For example, sometimes the input signal may contain an appreciable amount of noise. The noise may be converted into extra sync pulses in addition to the desired input sync pulses. The extra sync pulses may produce additional output pulses with a subsequent loss of synchronization. This problem can be corrected by using an additional gate to inhibit the passage of the input signal at all times except during a small period of time at which the input sync pulse is expected.

The invention has been described with reference to a particular embodiment but it will be appreciated that other embodiments and adaptions may be made and the invention is only to be limited by the appended claims.

What is claimed is:

1. In combination in a system for continuously generating an output pulse signal in synchronism with an input pulse signal during periods when the pulses are missing from the input pulse signal, first means responsive to the input pulse signal for generating a signal having an amplitude value in accordance with the time displacement between successive pulses in the input pulse signal, second means operatively coupled to the first means for storing the signal generated by the first means, third means responsive to the input pulse signal for producing an output pulse signal with individual pulses of the output pulse signal corresponding to individual pulses in the input pulse signal, fourth means responsive to the input pulse signal for detecting the absence of pulses in the input pulse signal, and fifth means operatively coupled to the second means and the fourth means and responsive to the stored signal for producing output pulses having a time displacement in accordance with the value of the stored signal during periods of time the fourth means detects the absence of pulses.

2. In combination in a system for generating an output pulse signal in response to an input pulse signal during periods of time when pulses are present in the input pulse signal and during periods of time when the pulses are missing from the input pulse signal, first means responsive to the input pulse signal for producing an analog signal having individual values representative of the time displacement between successive pulses in the pulse signal, second means operatively coupled to the first means for storing a value of the analog signal representative of the time displacement between successive pulses in the input pulse signal, third means responsive to the input pulse signal for producing an output signal having individual pulses corresponding to the appearance of individual pulses in the input pulse signal, fourth means operatively coupled to the first and second means for comparing the individual values of the analog signal with the value of the stored signal to produce a control signal when the analog signal reaches a predetermined value larger than the stored signal, and fifth means operatively coupled to the fourth means for producing an output pulse in response to the control signal.

3. In combination in a system for generating an output pulse signal in response to an input pulse signal during periods of time when pulses are present in the input pulse signal and during periods of time when the pulses are missing from the input pulse signal, first means responsive to the input pulse signal for producing an analog signal having individual values representative of the time displacement between successive pulses in the pulse signal, second means operatively coupled to the first means for storing a value of the analog signal representative of the time displacement between successive pulses in the input pulse signal, third means responsive to the input pulse signal for producing an output pulse signal having individual pulses corresponding to the appearance of individual pulses in the input pulse signal, fourth means operatively coupled to the first and second means for comparing the individual values of the analog signal with the value of the stored signal to produce a first control signal when the analog signal reaches a predetermined value larger than the stored signal, fifth means operatively coupled to the first and second means and responsive to the first control signal for comparing the individual values of the analog signal with the value of the stored signal after the appearance of the first control signal to produce a second control signal when the analog signal reaches the value of the stored signal, and sixth means operatively coupled to the fourth and fifth means for reproducing output pulses in response to the first and second control signals.

4. In combination in a system for continuously generating an output pulse signal in synchronism with an input pulse signal during periods when the pulses are missing from the input pulse signal, first means responsive to the input pulse signal for generating a signal having an amplitude value in accordance with the time displacement between successive pulses in the input pulse signal, second means responsive to the input pulse signal for producing an output pulse signal with individual pulses of the output pulse signal corresponding to individual pulses in the input pulse signal, third means responsive to the input pulse signal for detecting the absence of pulses in the input pulse signal, fourth storage means, fifth means operatively coupled to the first, third and fourth means for coupling the signal generated by the first means to the fourth storage means during the presence of pulses in the input signal and for decoupling the signal generated by the first means from the fourth storage means during the absence of pulses in the input signal, and sixth means operatively coupled to the third means and responsive to the stored signal for producing output pulses having a time displacement in accordance with the value of the stored signal during periods of time the third means detects the absence of pulses.

5. In combination in a system for generating an output pulse signal in response to an input pulse signal during periods of time when pulses are present in the input pulse signal and during periods of time when the pulses are missing from the input pulse signal, first means responsive to the input pulse signal for producing an analog signal having individual values representative of the time displacement between successive pulses in the pulse signal, second storage means, third means operatively coupled to the first and second means for coupling a value of the analog signal representative of the time displacement between successive pulses in the input pulse signal to the storage means, fourth means responsive to the input pulse signal for producing an output pulse signal having individual pulses corresponding to the appearance of individual pulses in the input pulse signal, fifth means operatively coupled to the first and second means for comparing the individual values of the analog signal with the value of the stored signal to produce a control signal when the analog signal reaches a predetermined value larger than the stored signal, sixth means operatively coupled to the third and fourth means for decoupling the analog signal from the storage means upon the appearance of the control signal, and seventh means operatively coupled to the fifth means for producing an output pulse in response to the control signal.

6. In combination in a system for generating an output pulse signal in response to an input pulse signal during periods of time when pulses are present in the input pulse signal and during periods of time when the pulses are missing from the input pulse signal, first means responsive to the input pulse signal for producing an analog signal having individual values representative of the time displacement between successive pulses in the pulse signal, second storage means, third means operatively coupled to the first and second means for coupling a value of the analog signal representative of the time displacement between successive pulses in the input pulse signal, fourth means responsive to the input pulse signal for producing an output pulse signal having individual pulses corresponding to the appearance of individual pulses in the input pulse signal, fifth means operatively coupled to the first and second means for comparing the individual values of the analog signal with the value of the stored signal to produce a first control signal when the analog signal reaches a predetermined value larger than the stored signal, sixth means operatively coupled to the first and second means for comparing the individual values of the analog signal with the value of the stored signal to produce a second control signal when the analog signal reaches the value of the stored signal, seventh means operatively coupled to the third and fifth means for decoupling the analog signal from the storage means upon the appearance of the first control signal and for disconnecting the fifth means immediately after the appearance of the first control signal, and eighth means operatively coupled to the fourth and fifth means for reproducing output pulses in response to the first and second control signals.

7. In combination in a system for continuously generating an output pulse signal in synchronism with an input pulse signal during periods when the pulses are missing from the input pulse signal, first means responsive to the input pulse signal for generating a signal having an amplitude value in accordance with the time displacement between each pair of successive pulses in the input pulse signal, second storage means, third means operatively coupled to the first and second means for coupling the signal generated by the first means to the second storage means for all values of the signal generated by the first means smaller than a larger predetermined value of the signal generated by the first means, fourth means responsive to the input pulse signal for producing an output pulse signal with individual pulses of the output pulse signal corresponding to individual pulses in the input pulse signal, fifth means responsive to the input pulse signal for decting the absence of pulses in the input pulse signal, and sixth means operatively coupled to the second means and the fifth means and responsive to the stored signal for producing output pulses having a time displacement in acordance with the value of the stored signal during periods of time the fifth means detects the absence of pulses.

8. In combination in a system for generating an output pulse signal in response to an input pulse signal during periods of time when pulses are present in the input pulse signal and during periods of time when the pulses are missing from the input pulse signal, first means responsive to the input pulse signal for producing an analog signal having individual values representative of the time displacement between each pair of successive pulses in the pulse signal, second storage means, third means operatively coupled to the first and second means for coupling the value of the analog signal to the second storage means for all values of the analog signal smaller than a predetermined value of the analog signal larger than the previously stored value of the analog signal, fourth means responsive to the input pulse signal for producing an output pulse signal having individual pulses corresponding to the appearance of individual pulses in the input pulse signal, fifth means operatively coupled to the first and second means for comparing the individual values of the analog signal with the value of the stored signal to produce a control signal when the analog signal reaches the predetermined value larger than the stored signal, and sixth means operatively coupld to the fifth means for producing an output pulse in response to the control signal.

9. In combination in a system for generating an output pulse signal in response to an input pulse signal during periods of time when pulses are present in the input pulse signal and during periods of time when the pulses are missing from the input pulse signal, first means responsive to the input pulse signal for producing an analog signal having individual values representative of the time displacement between each pair of successive pulses in the pulse signal, second storage means, third means operatively coupled to the first and second means for coupling the value of the analog signal to the second storage means for all values of the analog signal smaller than a predetermined value of the analog signal larger than the previously stored value of the analog signal, fourth means responsive to the input pulse signal for producing an output pulse signal having individual pulses corresponding to the appearance of individual pulses in the input pulse signal, fifth means operatively coupled to the first and second means for comparing the individual values of the analog signal with the value of the stored signal to produce a first control signal when the analog signal reaches the predetermined value larger than the stored signal, sixth means operatively coupled to the first and second means for comparing the individual values of the analog signal with the value of the stored signal to produce a second control signal when the analog signal reaches the value of the stored signal, seventh means operatively coupled to the fifth means for disconnecting the fifth means immediately after the appearance of the first control signal, and eighth means operatively coupled to the fifth and sixth means for reproducing output pulses in response to the first and second control signals.

10. In combination in a system for continuously generating an output pulse signal in synchronism with an input pulse signal during periods when the pulses are missing from the input pulse signal, first means responsive to the input pulse signal for generating a signal having an amplitude value in accordance with the time displacement between successive pulses in the input pulse signal, second means operatively coupled to the first means for storing the signal generated by the first means, third means responsive to the input pulse signal for producing an output pulse signal with individual pulses of the output pulse signal corresponding to individual pulses in the input pulse signal, fourth means responsive to the input pulse signal for detecting the absence of pulses in the input pulse signal, fifth means operatively coupled to the second means and the fourth means and responsive to the stored signal for producing output pulses having a time displacement in accordance with the value of the stored signal during periods of time the fourth means detects the absence of pulses, sixth means operatively coupled to the fifth means and responsive to the production of output pulses by the fifth means for producing a control signal in accordance with a predetermined number of times the fifth means produces output pulses, and seventh means operatively coupled to the sixth means and responsive to the control signal for disconnecting the fourth means upon the appearance of the control signal.

11. The combination of claim 10 wherein the seventh means additionally controls the storing of a new amplitude value of the signal generated by the first means.

12. In combination in a system for generating an output pulse signal in response to an input pulse signal during periods of time when pulses are present in the input pulse signal and during periods of time when the pulses are missing from the input pulse signal, first means responsive to the input pulse signal for producing an analog signal having individual values representative of the time displacement between successive pulses in the pulse signal, second means operatively coupled to the first means for storing a value of the analog signal representative of the time displacement between successive pulses in the input pulse signal, third means responsive to the input pulse signal for producing an output pulse signal having individual pulses corresponding to the appearance of individual pulses in the input pulse signal, fourth means operatively coupled to the first and second means for comparing the individual values of the analog signal with the value of the stored signal to produce a control signal when the analog signal reaches a predetermined value large than the stored signal, fifth means operatively coupled to the fourth means for producing an output pulse in response to the control signal, and sixth means operatively coupled to the fourth and fifth means and responsive to the production of control signals by the fourth means for disconnecting the fifth means on the appearance of a predetermined number of control signals produced by the fourth means.

13. The combination of claim 12 wherein the sixth means additionally controls the storing of a new value of the analog signal representative of successive pulses in the pulse signal.

14. In combination in a system for generating an output pulse signal in response to an input pulse signal during periods of time when pulses are present in the input pulse signal and during periods of time when the pulses are missing from the input pulse signal, first means responsive to the input pulse signal for producing an analog signal having individual values representative of time displacement between successive pulses in the pulse signal, second means operatively coupled to the first means for storing a value of the analog signal representative of the normal time displacement between successive pulses in the input pulse signal, third means responsive to the input pulse signal for producing an output pulse signal having individual pulses corresponding to the appearance of individual pulses in the input pulse signal, fourth means operatively coupled to the first and second means for comparing the individual values of the analog signal with the value of the stored signal to produce a first control signal when the analog signal reaches a predetermined value larger than the stored signal, fifth means operatively coupled to the first and second means and responsive to the first control signal for comparing the individual values of the analog signal with the value of the stored signal after the appearance of the first control signal to produce a second control signal when the analog signal reaches the value of the stored signal, sixth means operatively coupled to the fourth and fifth means for producing output pulses in response to the first and second control signals, and seventh means operatively coupled to the fourth and sixth means for disconnecting the sixth means upon the appearance of a predetermined number of first control signals produced by the fourth means.

15. The combination of claim 14 wherein the seventh means additionally controls the storing of a new value of the analog signal representative of successive pulses in the pulse signal.

References Cited by the Examiner

UNITED STATES PATENTS

| | | | |
|---|---|---|---|
| 2,980,858 | 4/61 | Grondin et al. | 328—73 X |
| 3,080,487 | 3/63 | Mellott et al. | 328—120 X |
| 3,153,762 | 10/64 | Johnson | 328—63 |

ARTHUR GAUSS, *Primary Examiner.*